United States Patent
Kim et al.

(10) Patent No.: US 8,023,320 B2
(45) Date of Patent: Sep. 20, 2011

(54) RESISTANCE-CHANGE RANDOM ACCESS MEMORY DEVICE INCLUDING MEMORY CELLS CONNECTED TO DISCHARGE ELEMENTS

(75) Inventors: Hye-jin Kim, Seoul (KR); Kwang-ho Kim, Hwaseong-si (KR); Young-kug Moon, Suwon-si (KR); Byung-gil Choi, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 10 days.

(21) Appl. No.: 12/591,238

(22) Filed: Nov. 13, 2009

(65) Prior Publication Data

US 2010/0124103 A1    May 20, 2010

(30) Foreign Application Priority Data

Nov. 14, 2008  (KR) .......................... 10-2008-0113342

(51) Int. Cl.
*G11C 11/00*    (2006.01)
(52) U.S. Cl. ......... 365/163; 365/175; 365/203; 365/148
(58) Field of Classification Search .................. 365/163, 365/175, 203, 148
See application file for complete search history.

(56) References Cited

U.S. PATENT DOCUMENTS

| 6,826,079 | B2 | 11/2004 | Tran | |
|---|---|---|---|---|
| 6,873,538 | B2 | 3/2005 | Hush | |
| 7,206,216 | B2 * | 4/2007 | Osada et al. | 365/148 |
| 7,391,644 | B2 | 6/2008 | Cho et al. | |
| 7,688,622 | B2 * | 3/2010 | Kang et al. | 365/163 |
| 7,843,720 | B2 * | 11/2010 | Kim et al. | 365/163 |
| 2008/0232161 | A1 | 9/2008 | Choi et al. | |

FOREIGN PATENT DOCUMENTS

KR    10-2007-0056667 A    6/2007

\* cited by examiner

*Primary Examiner* — Connie Yoha
(74) *Attorney, Agent, or Firm* — Lee & Morse, P.C.

(57) ABSTRACT

A resistance-change random access memory device includes a resistance-change memory cell array having a plurality of resistance-change memory cells, where a plurality of word lines are connected to respective first terminals of the plurality of resistance-change memory cells. A plurality of bit lines are disposed perpendicular to the word lines and connected to respective second terminals of the plurality of resistance-change memory cells. The device also includes a plurality of discharge elements that are capable of connecting or disconnecting respective bit lines from a discharge voltage, where the discharge elements connect the respective bit lines to the discharge voltage before write and read operations.

12 Claims, 7 Drawing Sheets

RESISTANCE-CHANGE RANDOM ACCESS MEMORY DEVICE INCLUDING MEMORY CELLS CONNECTED TO DISCHARGE ELEMENTS

BACKGROUND OF THE INVENTION

1. Field

The disclosed embodiments relate to a resistance-change random access memory device, and more particularly, to a resistance-change random access memory device that discharges bit lines before a write operation and a read operation.

2. Description of the Related Art

Phase-change Random Access Memory (PRAM), which is a type of resistance-change random access memory device, is a non-volatile memory that stores data using a material (hereinafter, "phase-change material") whose resistance varies as its phase changes according to temperature variations, e.g. Ge—Sb—Te (GST). PRAM may have all the advantages of Dynamic Random Access Memory (DRAM), along with non-volatile and low-power consumption characteristics. Thus PRAM is being considered as the next-generation memory.

SUMMARY

It is a feature of exemplary embodiments to provide a phase-change random access memory (PRAM) device that discharges bit lines before a write operation and a read operation, which substantially overcome one or more of the problems due to the limitations and disadvantages of the related art.

It is another feature of an exemplary embodiment to provide a phase-change random access memory (PRAM) device that discharges bit lines of a selected re-change memory cell block to a discharge voltage, and connects bit lines of a non-selected phase-change memory cell block to a discharge voltage or floats the bit lines. This substantially overcomes one or more of the problems due to the limitations and disadvantages of the related art.

At least one of the above and other features and advantages may also be realized by providing a memory device including a resistance-change memory cell array having a plurality of resistance-change memory cells, a plurality of word lines connected to respective first terminals of the plurality of resistance-change memory cells, a plurality of bit lines disposed perpendicular to the word lines and are connected to respective second terminals of the plurality of resistance-change memory cells, and a plurality of discharge elements capable of connecting and disconnecting respective bit lines from a discharge voltage. Where the discharge elements may connect the respective bit lines to the discharge voltage before write and read operations. Moreover, the resistance-change memory cell array may be a resistance-change memory cell array, and the resistance-change memory cells may be diode-type resistance-change memory cells.

The resistance-change random access memory device may include a plurality of bit line selection elements connected to terminals of the respective bit lines and may be capable of selecting or deselecting respective bit lines for write and read operations. Where, the discharge elements may connect respective bit lines to the discharge voltage before the respective bit lines and corresponding word lines may be selected or deselected for write and read operations. Furthermore, the discharge voltage may have a ground voltage level. All discharge voltages may also have a same value. Moreover, the resistance-change random access memory device may include a plurality of discharge voltage selection elements, connected to respective discharge elements, that may select one of a plurality of discharge voltages as the discharge voltage.

The resistance-change random access memory device may also include first terminals connected to the respective bit lines, second terminals connected to the discharge voltage, and discharge transistors, each discharge transistor including a gate connected to a discharge control signal. Where the discharge control signal may be set to an enabled state before a bit line selection signal controlling the respective bit lines is enabled or disabled, and may be set to the enabled state before a word line selection signal controlling the corresponding word lines is enabled or disabled.

At least one of the above and other features and advantages may also be realized by providing the memory device where the discharge elements connect respective bit lines of a selected resistance-change memory cell block to a first discharge voltage and connect respective bit lines of a non-selected resistance-change memory cell block to a second discharge voltage or float the respective bit lines, before the respective bit lines of the selected resistance-change memory cell block and corresponding word lines are selected or deselected for write and read operations.

The resistance-change random access memory device may have the first discharge voltage being a ground voltage level, and the second discharge voltage being one of a ground voltage level and a voltage level that is equal to a voltage level applied to word lines of the non-selected resistance-change memory cell block. The resistance-change random access memory device may also include a plurality of discharge voltage selection elements, connected to respective discharge elements, that selects one of a plurality of discharge voltages as the first discharge voltage or the second discharge voltage.

The resistance-change random access memory device further may include first terminals connected to the respective bit lines, second terminals connected to one of the first discharge voltage and the second discharge voltage, and discharge transistors, each discharge transistor including a gate connected to a discharge control signal. Where the discharge control signal may be set to an enabled state before a bit line selection signal controlling the respective bit lines is enabled or disabled, and may be set to the enabled state before a word line selection signal controlling the corresponding word lines is enabled or disabled.

Moreover, in the resistance-change random access memory device where at least one of the discharge transistors connected to bit lines of a selected resistance-change memory cell block may turn on and connect the bit lines of the selected resistance-change memory cell block to the first discharge voltage, and at least one of the discharge transistors connected to bit lines of a non-selected resistance-change memory cell block may turn on and connect the bit lines of the non-selected resistance-change memory cell block to the second discharge voltage. Alternatively, where at least one of the discharge transistors connected to bit lines of a selected resistance-change memory cell block may turn on and connect the bit lines of the selected resistance-change memory cell block to the first discharge voltage, and at least one of the discharge transistors connected to bit lines of a non-selected resistance-change memory cell block may turn off and float the bit lines of the non-selected resistance-change memory cell block.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Korean Patent Application No. 10-2008-0113342, filed on Nov. 14, 2008, in the Korean Intellectual Property Office, and entitled: "Phase-Change Random Access Memory Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

It will be understood that when an element or layer is referred to as being "on," "connected to," or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of:" For example, the expression "at least one of A, B, and C" may also include an nth member, where n is greater than 3, whereas the expression "at least one selected from the group consisting of A, B, and C" does not.

As used herein, the expression "or" is not an "exclusive or" unless it is used in conjunction with the term "either." For example, the expression "A, B, or C" includes A alone; B alone; C alone; both A and B together; both A and C together; both B and C together; and all three of A, B, and C together, whereas the expression "either A, B, or C" means one of A alone, B alone, and C alone, and does not mean any of both A and B together; both A and C together; both B and C together; and all three of A, B, and C together.

Figure 1:
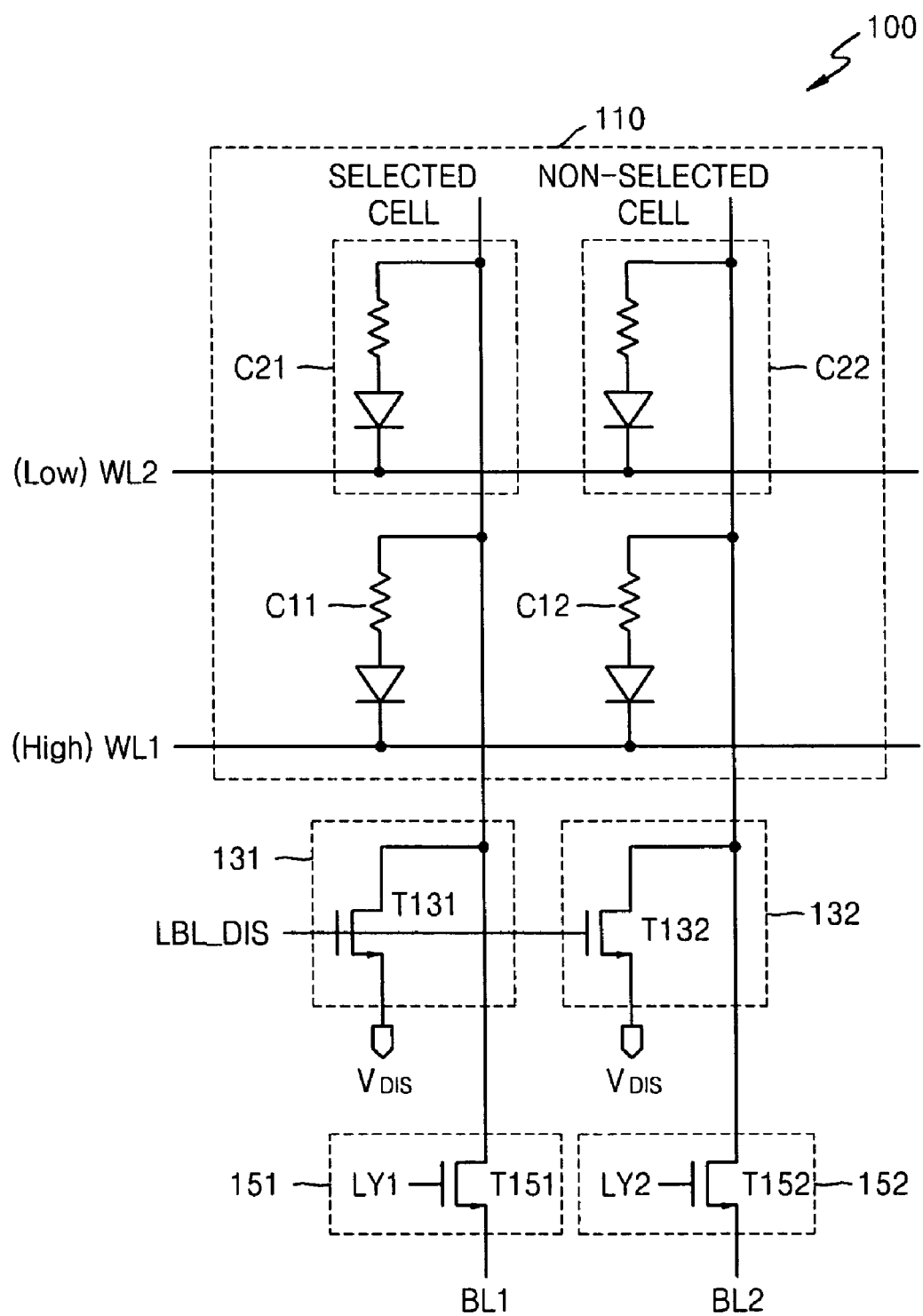
FIG. 1 illustrates a circuit diagram of a resistance-change random access memory device according to an exemplary embodiment.

FIG. 1 illustrates a circuit diagram of a phase-change random access memory (PRAM) device 100 according to an exemplary embodiment. Referring to FIG. 1, the PRAM device 100 may include a phase-change memory cell array 110, a plurality of word lines WL1 and WL2, a plurality of bit lines BL1 and BL2, and a plurality of discharge elements 131 and 132.

As illustrated in FIG. 1, the phase-change memory cell array 110 may include a plurality of diode-type phase-change memory cells C11, C12, C21, and C22 disposed in an array. The word lines WL1 and WL2 may be connected to first terminals of the diode-type phase-change memory cells C11 and C12, and C21 and C22, respectively. The bit lines BL1 and BL2 may be disposed perpendicular to the word lines WL1 and WL2. Therefore, bit lines BL1 and BL2 may be connected to second terminals of the diode-type phase-change memory cells C11 and C21, and C12 and C22, respectively.

FIG. 1 further illustrates an exemplary embodiment where the discharge elements 131 and 132 connect bit lines BL1 and BL2, respectively, to a discharge voltage $V_{DIS}$. According to this embodiment, the discharge elements 131 and 132 may connect the bit lines BL1 and BL2, respectively, to the discharge voltage $V_{DIS}$ before a write operation and/or a read operation is performed by the PRAM device 100.

The discharge voltage $V_{DIS}$ may have a ground voltage level or a voltage level arbitrarily selected by a user. Alternatively, the PRAM device may have a structure that enables the selection of one of a plurality of voltage levels as the discharge voltage $V_{DIS}$.

The discharge elements 131 and 132 may discharge the bit lines BL1 and BL2, respectively, before the write operation and/or the read operation. In other words. the discharge elements 131 and 132 may connect the bit lines BL1 and BL2, respectively, to the discharge voltage $V_{DIS}$ before the word lines WL1 and WL2 and the bit lines BL1 and BL2 are selected or deselected for write and/or read operations. To discharge the bit lines BL1 and BL2 to the discharge voltage $V_{DIS}$, the discharge elements 131 and 132 may connect the respective bit lines BL1 and BL2 to the discharge voltage $V_{DIS}$. By connecting the bit lines BL1 and BL2 to the discharge voltage $V_{DIS}$, the bit lines BL1 and BL2 may each be discharged to the discharge voltage $V_{DIS}$. Furthermore, the discharge elements 131 and 132 may disconnect the respective bit lines BL1 and BL2 from the discharge voltage $V_{DIS}$.

Additionally, the discharge elements 131 and 132 may include discharge transistors T131 and T132. First terminals (drains or sources) of the discharge transistors T131 and T132 are connected to respective bit lines BL1 and BL2. Furthermore, second terminals (sources or drains) of the discharge transistors T131 and T132 are connected to the discharge voltage $V_{DIS}$. In addition, gates of the discharge transistors T131 and T132 may be configured to receive a discharge control signal LBL_DIS, as shown in FIG. 1. Therefore, the gates of the discharge transistors T131 and T132 may be connected to the control signal LBL_DIS. In an exemplary embodiment, when the discharge control signal LBL_DIS is in a logic-high state, the discharge transistors T131 and T132 are turned on and the bit lines BL1 and BL2 are discharged to the discharge voltage $V_{DIS}$.

As shown in FIG. 1, the PRAM device 100, according to an exemplary embodiment, may further include bit line selection elements 151 and 152. The bit line selection elements 151 and 152, which are respectively connected to terminals of the bit lines BL1 and BL2, may select or deselect the bit lines BL1 and BL2 for the write and read operations. The bit line selection elements 151 and 152 may include respective bit line selection transistors T151 and T152. The bit line selection transistors T151 and T152 are capable of selecting bit lines connected to memory cells that are sensing targets. For example, assuming that the diode-type phase-change memory cell C22 is a target memory cell that is to be sensed, the bit line selection transistor T152 may select the bit line BL2 when the bit line selection transistor T152 is turned on in response to a bit line selection control signal LY2. The bit line selection transistor T151 operates in a similar manner as the bit line selection transistor T152, where the transistor T151 may be turned on in response to a bit line selection control signal LY1.

Figure 2:
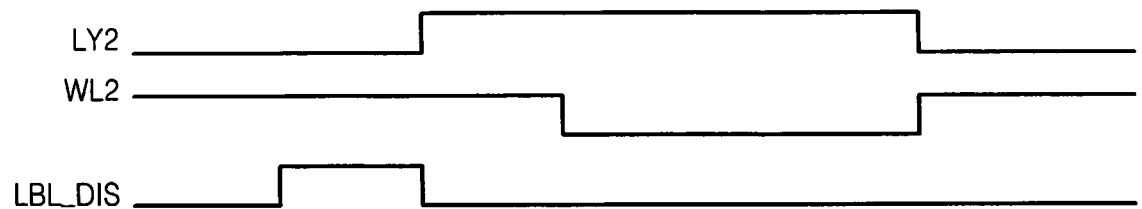
FIG. 2 illustrates a timing diagram of different signals of the exemplary resistance-change random access memory device illustrated in FIG. 1.

FIG. 2 illustrates a timing diagram of different signals in the exemplary PRAM device 100 illustrated FIG. 1. Referring to the exemplary timing diagram shown in FIG. 2, the discharge control signal LBL_DIS may transit to a logic high (enabled) before the word line WL2 transmits to a logic low (is enabled). In addition, the discharge control signal LBL_DIS may transit to a logic high (enabled) before the bit line BL2 is selected when the bit line selection control signal LY2 transits to a logic high. Thus, the bit lines BL1 and BL2 may be discharged to the discharge voltage $V_{DIS}$ before the write and read operations.

Figure 3:
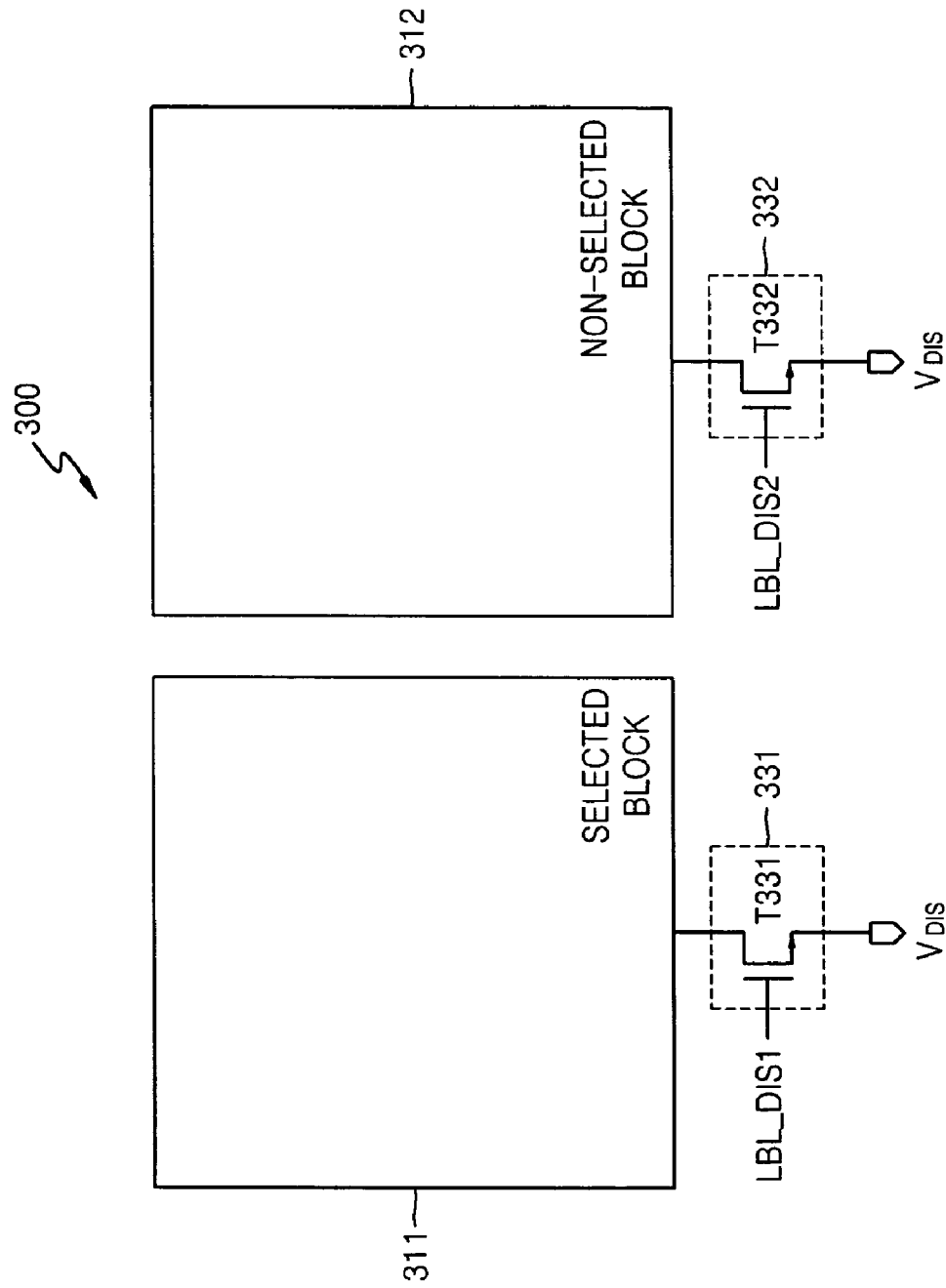
FIG. 3 illustrates a block diagram of a resistance-change random access memory device according to an exemplary embodiment.

FIG. 3 illustrates a block diagram of a PRAM device 300 according to an exemplary embodiment. As shown in to FIG. 3, the PRAM device 300 may include a first phase-change memory cell block 311, a second phase-change memory cell block 312, a first discharge element 331, and a second discharge element 332.

In addition, like the PRAM device 100 illustrated in FIG. 1, the PRAM device 300 may include word lines (not shown) and bit lines (not shown). Each of the first phase-change memory cell block 311 and the second phase-change memory cell block 312 may include a plurality of diode-type phase-change memory cells disposed in an array. The diode-type phase-change memory cells in the first and second phase-change memory cell blocks 311, 312 may be connected to word lines and bit lines like the PRAM device 100 illustrated in FIG. 1.

The first discharge element 331 and the second discharge element 332 may discharge or float the bit lines of the respective first phase-change memory cell block 311 and the second phase-change memory cell block 312, before the write operation and read operation. For example, as shown in FIG. 3, when the first phase-change memory cell block 311 is selected and the second phase-change memory cell block 312 is not selected, the first discharge element 331 may discharge the bit lines of the first phase-change memory cell block 311, while the second discharge element 332 may float the bit lines of the second phase-change memory cell block 312.

The first discharge element 331 and the second discharge element 332 may include a first discharge transistor T331 and a second discharge transistor T332, respectively. The first and second discharge transistors T331 and T332 may turn on or turn off in response to first and second discharge control signals LBL_DIS1 and LBL_DIS2, respectively. For example, when the first phase-change memory cell block 311 is selected and the second phase-change memory cell block 312 is not selected, the first discharge transistor T331 may turn on and connect the bit lines of the first phase-change memory cell block 311 to the bit line discharge voltage $V_{DIS}$. Furthermore, the second discharge transistor T332 may turn off and float the bit lines of the second phase-change memory cell block 312.

Figure 4:
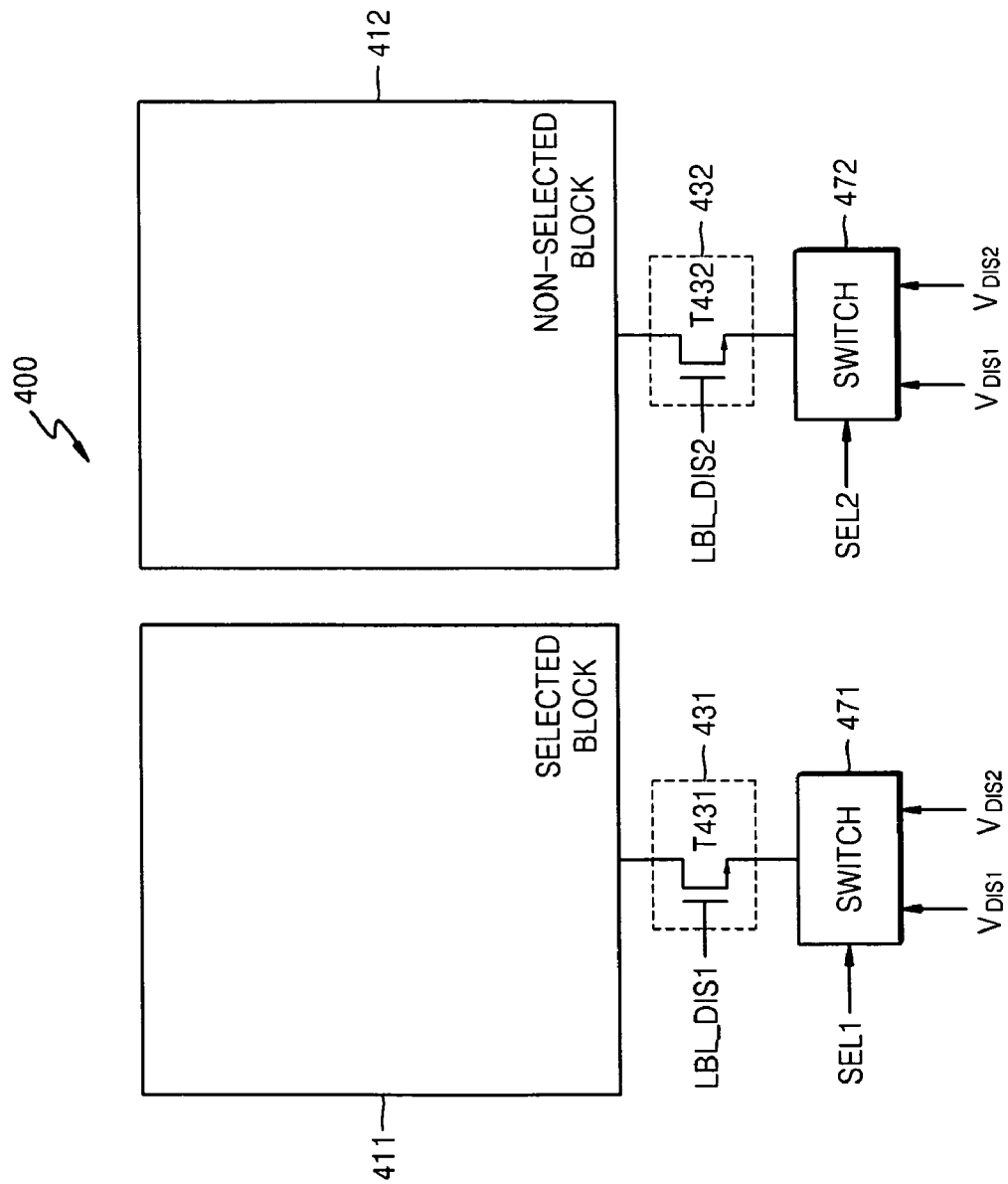
FIG. 4 illustrates a block diagram of a resistance-change random access memory device according to an exemplary embodiment.

FIG. 4 illustrates an exemplary block diagram of PRAM device 400, according to an exemplary embodiment. As shown in FIG. 4, a PRAM device 400 may include a first phase-change memory cell block 411, a second phase-change memory cell block 412, a first discharge element 431, a second discharge element 432, a first discharge voltage selection element 471, and a second discharge voltage selection element 472.

The PRAM device 400 may have the capability of discharging bit lines of the first and second phase-change memory cell blocks 411 and 412 to different discharge voltages VDIS1 and VDIS2, using the respective first and second discharge voltage selection elements 471 and 472. The first and second discharge voltage selection elements 471 and 472 select one of the first and second discharge voltages VDIS1 and VDIS2 in response to first and second selection signals SEL1 and SEL2, respectively. The selected discharge voltage is connected to first and second discharge transistors T431 and T432.

In an exemplary embodiment of the PRAM device 400, the first discharge voltage selection element 471 may select the first discharge voltage VDIS1 and the second discharge voltage selection element 472 may select the second discharge voltage VDIS2. In this case, when the first discharge transistor T431 turns on, the bit line of the first phase-change memory cell block 411 is discharged to the first discharge voltage VDIS1. In addition, when the second discharge transistor T432 turns on, the bit line of the second phase-change memory cell block 412 is discharged to the second discharge voltage VDIS2. Alternatively, either the first phase-change memory cell block 411 or the second phase-change memory cell block 412 may be floated by turning off the first discharge transistor T431 or the second discharge transistor T432.

Figure 5:
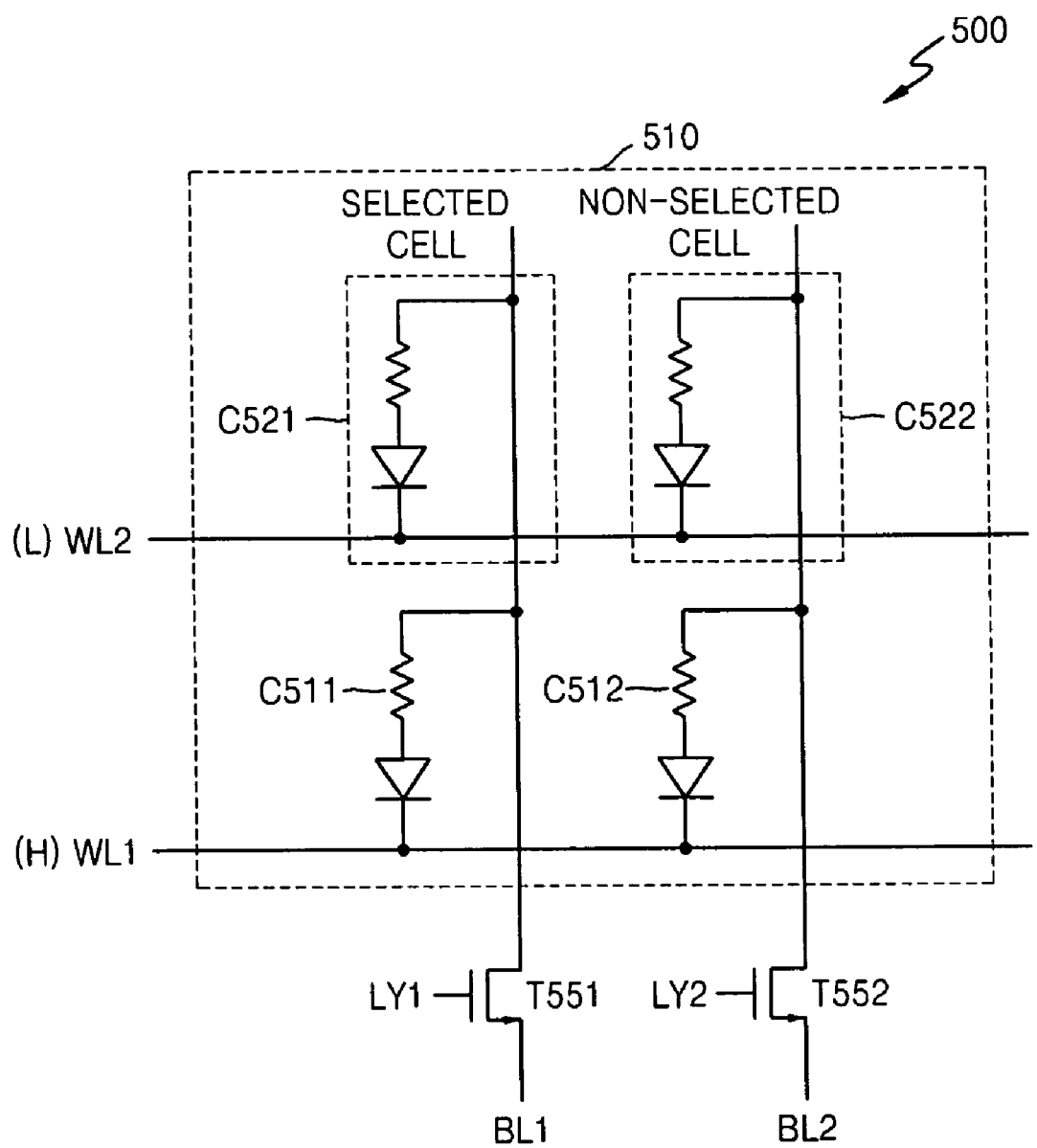
FIG. 5 illustrates a circuit diagram of a resistance-change random access memory device as an example for comparison with exemplary embodiments.

FIG. 5 illustrates a circuit diagram of a PRAM device 500, which is a comparative example. Unlike the PRAM device 100 illustrated in FIG. 1, the PRAM device 500 shown in FIG. 5 does not include elements corresponding to the first and second discharge elements 131 and 132, as shown in FIG. 1.

In regard to the embodiment illustrated in FIG. 5, since phase-change memory cells C511, C512, C521, and C522 are of a diode type, if voltage levels of bit lines BL1 and BL2 are higher than voltage levels of word lines WL1 and WL2, current paths may be formed from the bit lines BL1 and BL2 to the word lines WL1 and WL2. In particular, when the voltage level of the word line WL2 is a logic low, a current path may be readily formed.

In contrast, in the PRAM device 100 illustrated in FIG. 1, since the bit lines BL1 and BL2 may be discharged to the ground voltage level (it should be noticed here that the ground voltage level is suggested as an example) before a writing and/or reading operation, the current paths from the bit lines BL1 and BL2 to the word lines WL1 and WL2 are not formed.

Additionally, there are varied possible voltage levels for the discharge voltages in the exemplary embodiments of PRAM devices illustrated in FIGS. 1, 3, and 4. Although the following description is provided with reference to FIG. 3, it may apply to the PRAM devices illustrated in FIGS. 1 and 4.

In the PRAM devices 100, 300, and 400, the discharge voltage $V_{DIS}$ may have a ground voltage level. Alternatively, the discharge voltage $V_{DIS}$ may have a voltage level that is equal to the voltage level applied to word lines of non-selected phase-change memory cell blocks or arrays. For example, in reference to FIG. 3, the discharge voltage $V_{DIS}$ may have a voltage level that is equal to the voltage level applied to the word lines of the non-selected phase-change memory cell block 312.

In the case where the discharge voltage $V_{DIS}$ has a ground voltage level, the bit lines of the selected phase-change memory cell block 311 may be discharged to the discharge voltage $V_{DIS}$ that is a ground voltage level. Consequently, this arrangement may avoid the formation of the disadvantageous current path from the bit lines to the word lines, which is discussed above in regard to the comparative example illustrated in FIG. 5.

Alternatively, when the discharge voltage $V_{DIS}$ has a voltage level that is equal to the voltage level applied to the word lines of the non-selected, phase-change memory cell block 312, there is no potential difference between the bit lines and the word lines of the selected phase-change memory cell block 311. As a result, no current path is formed from the bit lines to the word lines.

In addition, PRAM devices 100, 300, and 400, as illustrated in FIGS. 1, 3 and 4, respectively, are exemplary embodiments of a generic description of the structure of a selected cell/or block and a non-selected cell/or block. Thus, unlike PRAM devices 100, 300, and 400, the numbers of phase-change memory cell blocks, discharge elements, and discharge voltage selection elements may vary.

Figure 6:
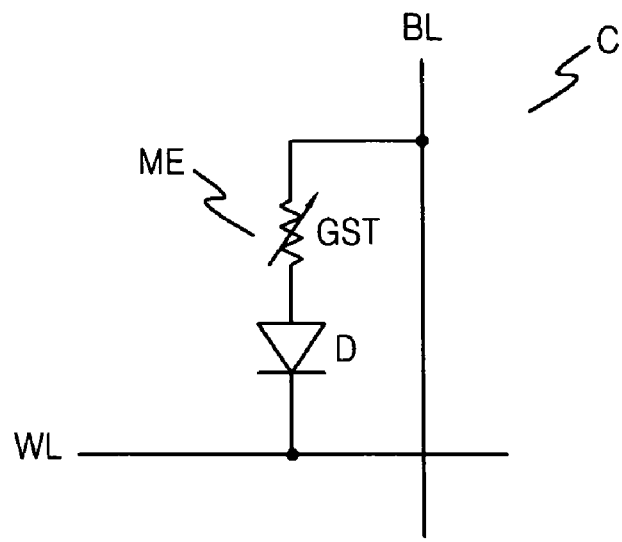
FIG. 6 illustrates an equivalent circuit diagram of an exemplary diode-type phase-change memory cell that may be included in the resistance-change random access memory devices of the exemplary embodiments of FIGS. 1, 3, and 4.

FIG. 6 illustrates an equivalent circuit diagram of a diode-type phase-change memory cell that may be included in the PRAM devices 100, 300, and 400, as shown in respective FIGS. 1, 3, and 4. Referring to FIG. 6, the diode-type phase-change memory cell is denoted as C. The phase-change memory cell arrays in FIGS. 1, 3, and 4 may include a plurality of diode-type phase-change memory cells each of which has the structure as illustrated in FIG. 6, which is discussed below.

Referring to FIG. 6, an exemplary embodiment of the diode-type phase-change memory cell (C) may include a memory device (ME) and a P-N diode (D). The memory device (ME) may contain a phase-change material (Ge—Sb—Te; GST), which may be connected to a bit line BL and a P-junction of the P-N diode (D). Furthermore, an N-junction of the P-N diode (D) may be connected to a word line WL.

The phase-change material (GST) in the diode-type phase-change memory cell (C) may be crystallized or changed to be amorphous depending on the temperature and heating time applied therein. This changing of a phase of the phase-change material may allow for the storing of information. To induce the phase-change material (GST) to change the phase, a high temperature of 900° C. or higher may be required. This high temperature may be obtained through Joule heating induced by the current flowing through the diode-type phase-change memory cell (C).

Figure 7:
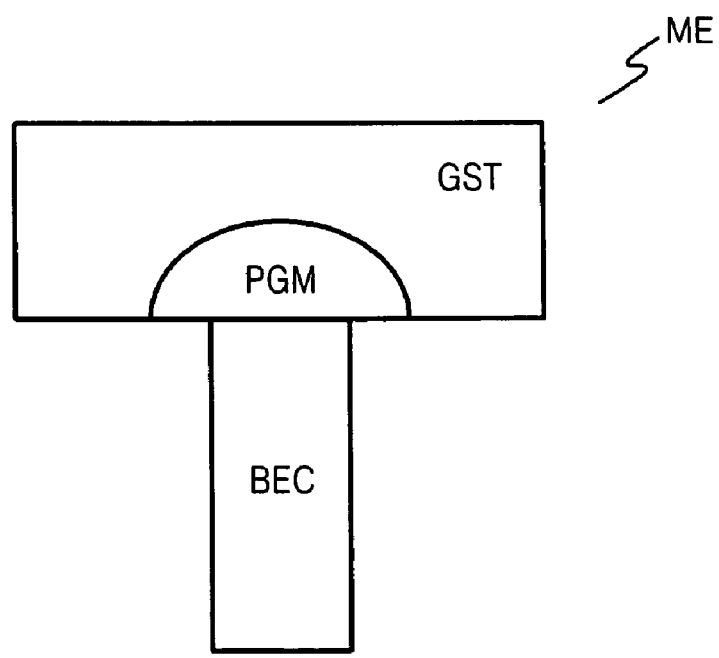
FIG. 7 illustrates a cross-sectional view of an exemplary memory device containing a phase-change material that may be used in the diode-type phase-change memory cell of FIG. 6.

FIG. 7 illustrates a cross-sectional view of the memory device (ME) containing the phase-change material (GST) shown in FIG. 6. Referring to FIG. 7, when a current is generated and supplied to a lower electrode (BEC) of the memory device (ME), the volume and phase of a site (PGM) in the phase-change material (GST) that contacts the lower electrode (BEC) changes. The volume and phase changes at the site (PGM) affect the crystalline condition of the phase-change material GST.

Figure 8:
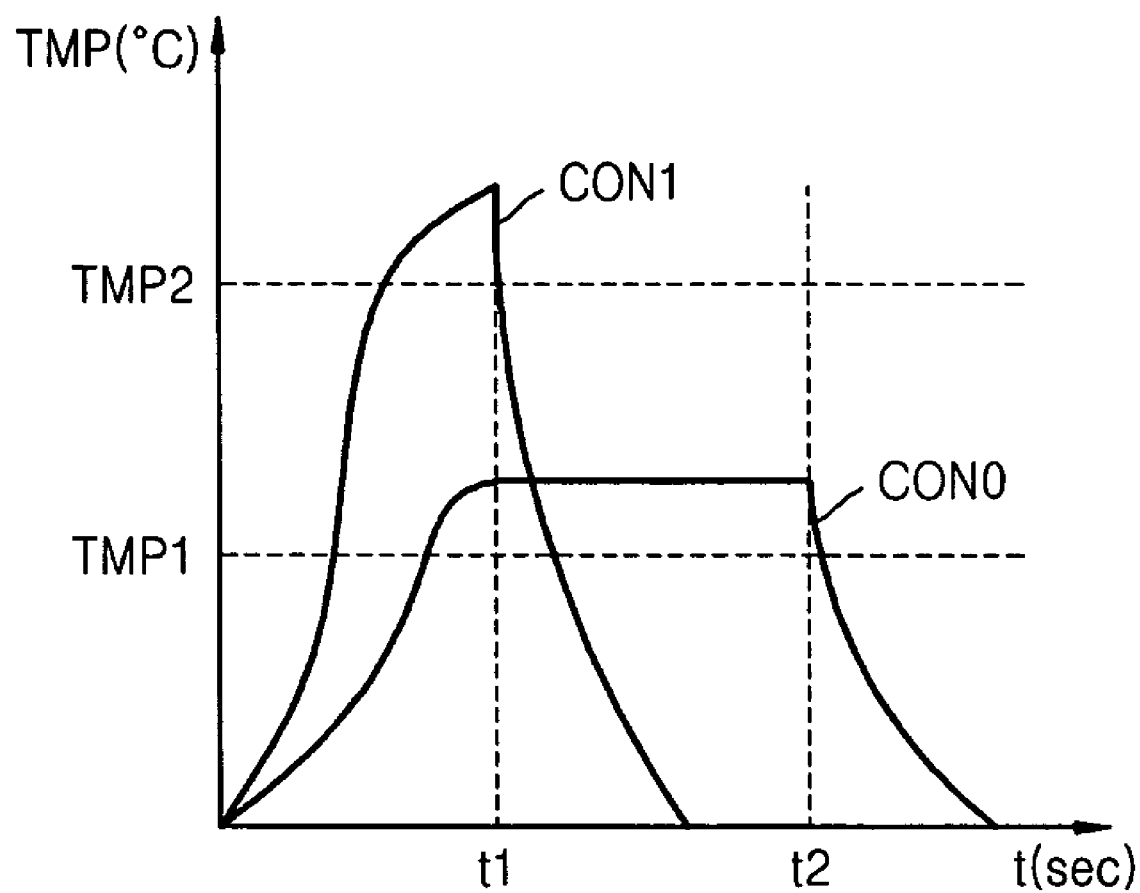
FIG. 8 illustrates a graph illustrating characteristics of the phase-change material that may be used in the diode-type phase-change memory cell of FIG. 6 and the memory device of FIG. 7.

FIG. 8 illustrates a graph showing characteristics of an exemplary phase-change material (GST). FIG. 8 includes a graph of "CON1" and CON0." The graph of "CON1" shows a condition for the phase-change material (GST) to change to the amorphous state, and the graph of "CON0" shows a condition for the phase-change material (GST) to change to the crystalline state.

The write and read operations in a PRAM device will be described below with reference to FIGS. 6 through 8. For the write operation, to store information "1" the phase-change material (GST) is heated for a period of time to a melting temperature (TMP2) or higher and then rapidly cooled. As a result, the phase-change material (GST) changes to the amorphous state. This amorphous state is defined as information "1". The amorphous state is also referred to as a "Reset" state. To store information "0", the phase-change material (GST) is heated to a crystallization temperature (TMP1) or higher, maintained at the same temperature for a period of time, and then slowly cooled. As a result, the phase-change material (GST) changes to the crystalline state. This state is defined as information "0". The crystalline state is also referred to as a "Set" state.

For the read operation, a phase-change memory cell (C) to be read is selected as a corresponding bit line (BL) and word line (WL) are selected. When a read current is supplied to the selected phase-change memory cell (C), the information "1" and "0" are distinguished from one another based on voltage variations according to the resistance of the phase-change material (GST).

In addition, the phase-change memory cells in FIGS. 1, 3 and 4 may be replaced with resistance-change memory cells. Examples of resistance-change memory cells include a magnetoresistive random access memory (MRAM) cell, a resistive random access memory (ReRAM) cell, a Racetrack memory cell, and the like. In accordance with embodiments a current path between bit lines and word lines may be avoided in such resistance change memory cells.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A resistance-change random access memory device, comprising:
   a resistance-change memory cell array that includes a plurality of resistance-change memory cells arranged in memory cell blocks;
   a plurality of word lines connected to respective first terminals of the plurality of resistance-change memory cells;
   a plurality of bit lines disposed perpendicular to the word lines and are connected to respective second terminals of the plurality of resistance-change memory cells, the plurality of word lines and the plurality of bit lines being configured to select resistance-change memory cells for write and read operations; and
   a plurality of discharge elements configured to connect and disconnect respective bit lines from a discharge voltage in response to a discharge control signal,
   wherein, when the discharge control signal is set to an enabled state before write and read operations, the discharge elements connect the respective bit lines of resistance-change memory cells in a selected memory cell block to the discharge voltage and the discharge elements float respective bit lines of resistance-change memory cells in a non-selected memory cell block.

2. The resistance-change random access memory device as claimed in claim 1, wherein the resistance-change memory cell array is a phase-change memory cell array, and the resistance-change memory cells are diode-type phase-change memory cells.

3. The resistance-change random access memory device as claimed in claim 1, further comprising:
a plurality of bit line selection elements connected to terminals of the respective bit lines and capable of selecting or deselecting respective bit lines for write and read operations.

4. The resistance-change random access memory device as claimed in claim 1, wherein the discharge voltage has a ground voltage level.

5. The resistance-change random access memory device as claimed in claim 1, wherein the discharge elements include:
first terminals connected to the respective bit lines;
second terminals connected to the discharge voltage; and
discharge transistors, each discharge transistor including a gate connected to the discharge control signal,
wherein the discharge control signal is set to the enabled state before a bit line selection signal controlling the respective bit lines is enabled or disabled, and is set to the enabled state before a word line selection signal controlling the corresponding word lines is enabled or disabled.

6. The resistance-change random access memory device as claimed in claim 1, further comprising:
a plurality of discharge voltage selection elements, connected to respective discharge elements, that select one of a plurality of discharge voltages as the discharge voltage.

7. The resistance-change random access memory device as claimed in claim 1, wherein the discharge elements include:
first terminals connected to the respective bit lines;
second terminals connected to the discharge voltage; and
discharge transistors, each discharge transistor including a gate connected to a discharge control signal.

8. The resistance-change random access memory device as claimed in claim 7, wherein the discharge control signal is set to an enabled state before a bit line selection signal controlling the respective bit lines is enabled or disabled, and is set to the enabled state before a word line selection signal controlling the corresponding word lines is enabled or disabled.

9. The resistance-change random access memory device as claimed in claim 1, wherein at least one of the discharge transistors connected to the respective bit lines of the selected memory cell block turns on and connects the bit lines to the discharge voltage, and
at least one of the discharge transistors connected to the respective bit lines of the non-selected memory cell block turns off and floats the bit lines.

10. The resistance-change random access memory device as claimed in claim 1, wherein all discharge voltages have a same value.

11. The resistance-change random access memory device as claimed in claim 1, wherein the discharge elements connect respective bit lines to the discharge voltage before the respective bit lines and corresponding word lines are selected or deselected for write and read operations.

12. A resistance-change random access memory device, comprising:
a resistance-change memory cell array that includes a plurality of resistance-change memory cells;
a plurality of word lines connected to respective first terminals of the plurality of resistance-change memory cells;
a plurality of bit lines disposed perpendicular to the word lines and are connected to respective second terminals of the plurality of resistance-change memory cells; and
a plurality of discharge elements configured to connect and disconnect respective bit lines from a discharge voltage, the discharge elements including first terminals connected to the respective bit lines, second terminals connected to the discharge voltage, and discharge transistors, each discharge transistor including a gate connected to a discharge control signal, wherein:
the discharge elements connect the respective bit lines to the discharge voltage before write and read operations;
the discharge elements connect respective bit lines of a selected resistance-change memory cell block to the discharge voltage and float respective bit lines of a non-selected resistance-change memory cell block before the respective bit lines of the selected resistance-change memory cell block and corresponding word lines are selected or deselected for write and read operations;
the discharge control signal is set to an enabled state before a bit line selection signal controlling the respective bit lines is enabled or disabled, and is set to the enabled state before a word line selection signal controlling the corresponding word lines is enabled or disabled;
at least one of the discharge transistors connected to bit lines of the selected resistance-change memory cell block turns on and connects the bit lines of the selected resistance-change memory cell block to the discharge voltage; and
at least one of the discharge transistors connected to bit lines of the non-selected resistance-change memory cell block turns off and floats the bit lines of the non-selected resistance-change memory cell block.

* * * * *